United States Patent
Connors

(10) Patent No.: US 6,966,361 B2
(45) Date of Patent: Nov. 22, 2005

(54) BI-LEVEL HEAT SINK

(75) Inventor: Matthew Joseph Connors, Lancaster, PA (US)

(73) Assignee: Thermal Corp., Wilmington, DE (US)

( * ) Notice: Subject to any disclaimer, the term of this patent is extended or adjusted under 35 U.S.C. 154(b) by 155 days.

(21) Appl. No.: 10/280,876

(22) Filed: Oct. 25, 2002

(65) Prior Publication Data

US 2003/0121643 A1 Jul. 3, 2003

Related U.S. Application Data

(62) Division of application No. 10/038,636, filed on Jan. 3, 2002, now Pat. No. 6,626,233.

(51) Int. Cl.⁷ .................................................. H05K 7/20
(52) U.S. Cl. ........................ 165/104.33; 174/15.2; 257/715; 361/700
(58) Field of Search .................... 165/80.3, 104.21, 165/104.26, 104.33, 104.14, 185; 361/700, 361/704; 257/714, 715; 174/15.2, 16.3

(56) References Cited

U.S. PATENT DOCUMENTS

| | | | |
|---|---|---|---|
| 5,560,423 A | 10/1996 | Larson et al. | |
| 5,720,339 A | 2/1998 | Glass et al. | |
| 5,819,402 A | 10/1998 | Edwards et al. | |
| 5,845,702 A | 12/1998 | Dinh | |
| 5,901,781 A | 5/1999 | Arai et al. | |
| 5,921,315 A | 7/1999 | Dinh | |
| 5,959,837 A | 9/1999 | Yu | |
| 6,082,443 A | 7/2000 | Yamamoto et al. | |
| 6,102,110 A | 8/2000 | Julien et al. | |
| 6,163,073 A | 12/2000 | Patel | |
| 6,167,948 B1 | 1/2001 | Thomas | |
| 6,172,872 B1 | 1/2001 | Katsui | |
| 6,189,601 B1 | 2/2001 | Goodman et al. | |
| 6,250,375 B1 | 6/2001 | Lee et al. | |
| 6,256,201 B1 | 7/2001 | Ikeda et al. | |
| 6,263,959 B1 | 7/2001 | Ikeda et al. | |
| 6,269,866 B1 | 8/2001 | Yamamoto et al. | |
| 6,367,541 B2 * | 4/2002 | McCullough | 165/80.3 |
| 6,424,528 B1 | 7/2002 | Chao | |
| 6,538,889 B1 * | 3/2003 | Barsun et al. | 361/704 |
| 6,626,233 B1 * | 9/2003 | Connors | 165/80.3 |

FOREIGN PATENT DOCUMENTS

JP 2-10800 A 1/1990

\* cited by examiner

*Primary Examiner*—Leonard R. Leo
(74) *Attorney, Agent, or Firm*—Duane Morris LLP

(57) ABSTRACT

A bi-level assembly comprises a heat sink, a processor and a power supply. The heat sink includes a base and at least one fin structure attached to the base. The base may be a plate with attached heat pipes or the base may be a vapor chamber. The base is connected to the top of the processor and power supply and has an s-bend to accommodate the differing heights of the processor and power supply. Heat from the higher heat generating processor may be transferred by the base and dissipated by the fins above the power supply.

9 Claims, 4 Drawing Sheets

6,966,361 B2

BI-LEVEL HEAT SINK

This application is a Divisional application of copending U.S. application Ser. No. 10/038,636, filed on Jan. 3, 2002 now U.S. Pat. No. 6,626,233.

FIELD OF THE INVENTION

The present invention relates generally to heat sinks and, more particularly, to heat sinks using heat pipe technology to efficiently utilize space in computer applications.

DESCRIPTION OF THE RELATED ART

The performance of electronic circuits and their semiconductor devices is affected by temperature and temperature swings. Semiconductor device performance degrades when the internal temperature reaches or exceeds a particular limit. For example, in silicon integrated circuit devices, for each ten degree centigrade rise in junction temperature, the operating lifetime of the semiconductor device is decreased by a factor of at least two. Demands by original equipment manufacturers (OEMs) for smaller package sizes and increased device densities has resulted in higher power densities and corresponding increases in temperature, with the concomitant need for efficient heat dissipation becoming extremely important.

The current trend in microprocessor design is to increase the level of integration and to shrink processor size. This results in an increase in both the raw power as well as the power density on silicon. Correspondingly, there is a desire to manage yield and reliability, all resulting in a need for lower operating temperatures. Compounding the thermal challenge is a thirst for a smaller form-factor chassis. In order to meet the demand for smaller, faster processing systems while still maintaining adequate cooling, it is critical to efficiently manage the thermal design space at the system level.

The newest workstations and servers are using 64-bit microprocessors which can generate more than 100 watts of heat. System reliability depends on keeping these microprocessors cool. Typically, workstations and servers using these microprocessors use expensive, custom-engineered heat sinks and large, variable-speed fans for cooling. Often the heat sink is located directly above the microprocessor, or a heat pipe is used to transfer heat from the microprocessor to a heat sink.

Certain designs for "ITANIUM™" processor based systems include "ITANIUM™" 64-bit microprocessors (by Intel Corporation of Santa Clara, Calif.) having power bricks sitting beside them. A heat sink is attached to the top of the microprocessor. As rack space in these systems is extremely expensive, platform designers want to make the best use of space possible. Currently, valuable space above the power supply is not being utilized. An, improved, more efficient heat transfer system is desired.

SUMMARY OF THE INVENTION

The present invention is an assembly comprising a processor having a first height. A component is next to the processor. The component is a heat source. The component has a second height different from the first height. A heat sink includes a base and at least one fin structure. The base of the heat sink is continuous and has a first side abutting the component and the processor. The base has an offset between the processor and component. The at least one fin structure is attached to a second side of the base opposite the first side.

BRIEF DESCRIPTION OF THE DRAWINGS

These and other features and advantages of the present invention is more fully disclosed in the following detailed description of the preferred embodiments of the invention, which are to be considered together with the accompanying drawings wherein like numbers refer to like parts and further wherein.

DETAILED DESCRIPTION OF THE PREFERRED EMBODIMENT

Figure 1:
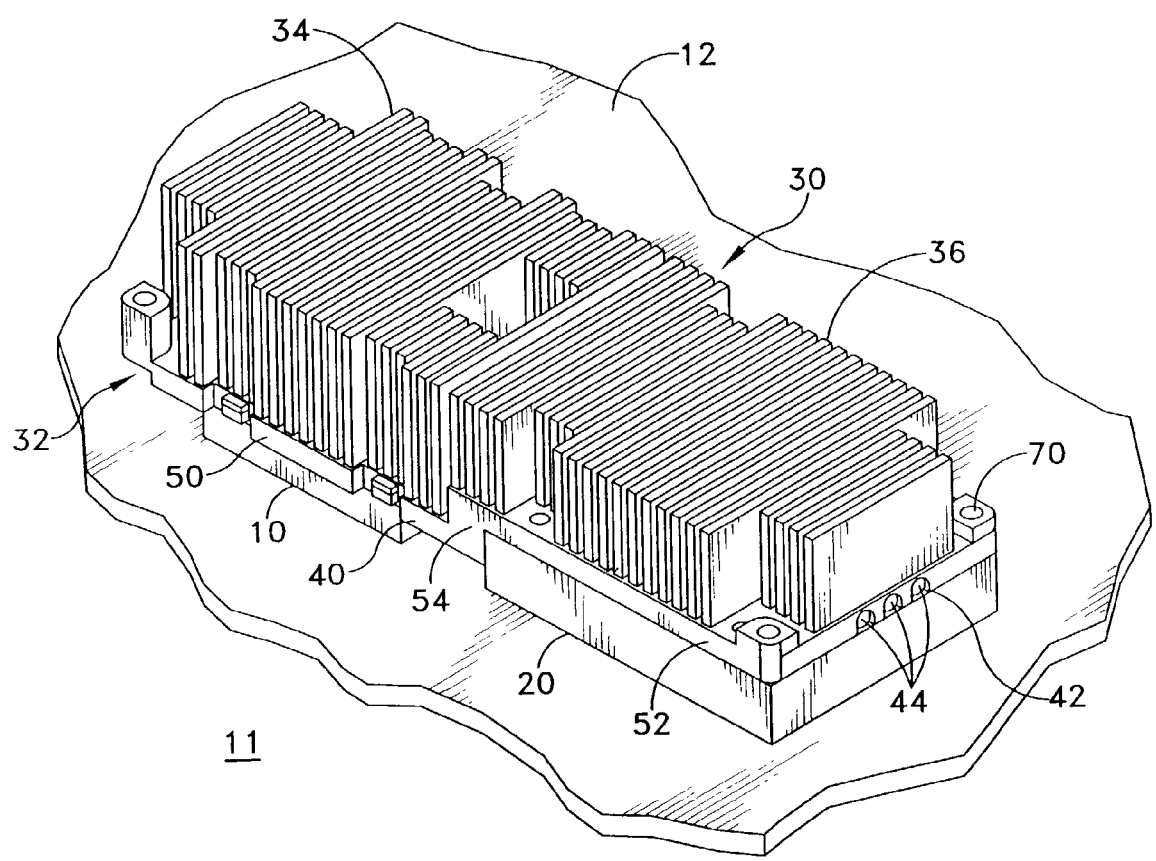
FIG. 1 is an isometric view of a processor/power supply/bi-level heat sink assembly having embedded heat pipes formed in accordance with one embodiment of the present invention.

This description of the preferred embodiments is intended to be read in connection with the accompanying drawings, which are to be considered part of the entire written description of this invention. In the description, relative terms such as "lower," "upper," "horizontal," "vertical,", "up," "down," "top" and "bottom" as well as derivative thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Referring to FIG. 1, an assembly 11 formed in accordance with one embodiment of the present invention includes a processor 10, a component 20 (which may be a power supply), and a bi-level heat sink 30. The processor 10 and power supply 20 are preferably in side-by-side relation, next to one another and have different heights from each other, where the heights are measured from the circuit board 12 on which processor 10 and power supply 20 are mounted. The processor 10 may include any type of integrated circuit package, but is preferably a microprocessor or CPU for computer applications. A preferred application for use of assembly 11 is on the motherboard of a workstation or server employing the Intel "ITANIUM™" 64-bit processor, wherein one current design includes the processor and the power supply situated beside each other on the board.

Figure 2:
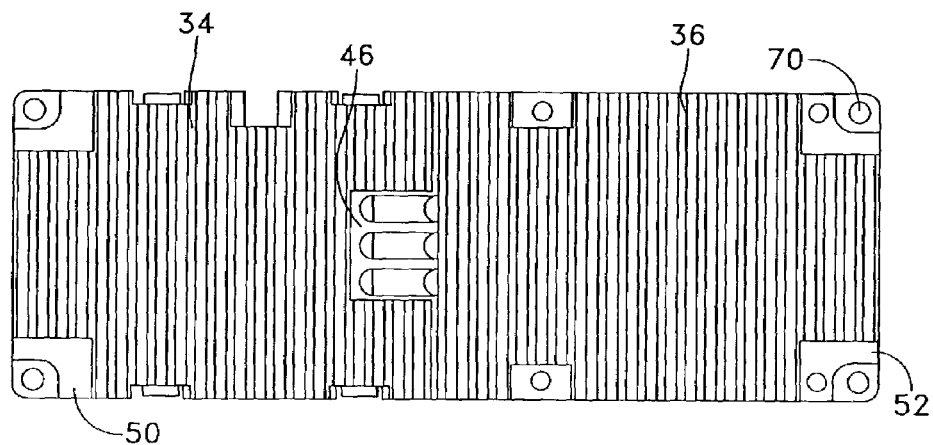
FIG. 2 is a top plan view of the bi-level heat sink shown in FIG. 1.
Figure 3A:
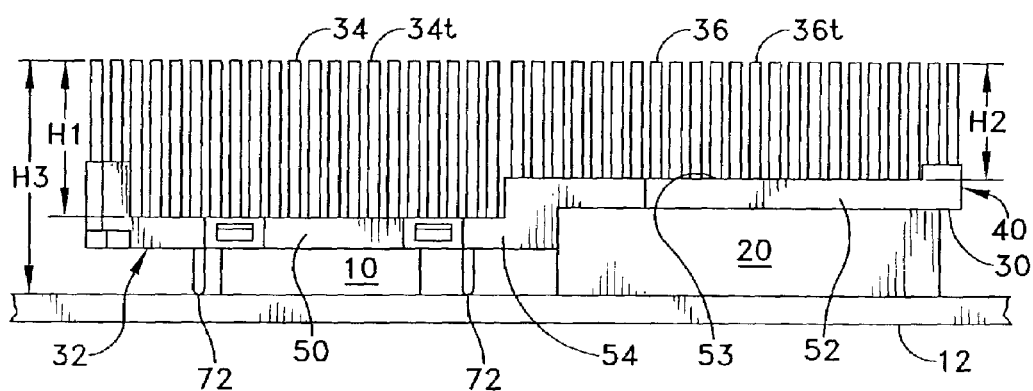
FIG. 3A is a cross-sectional view of the bi-level heat sink shown in FIG. 1.
Figure 3B:
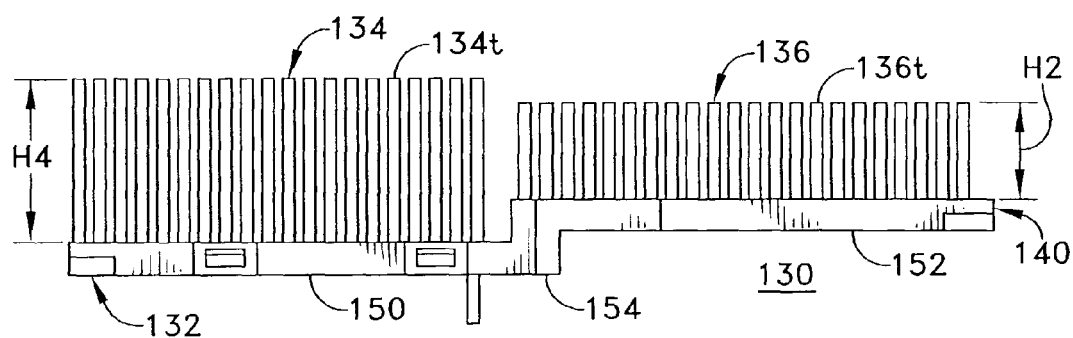
FIG. 3B is a cross-sectional view of a variation of the bi-level heat sink shown in FIG. 3A.
Figure 4:
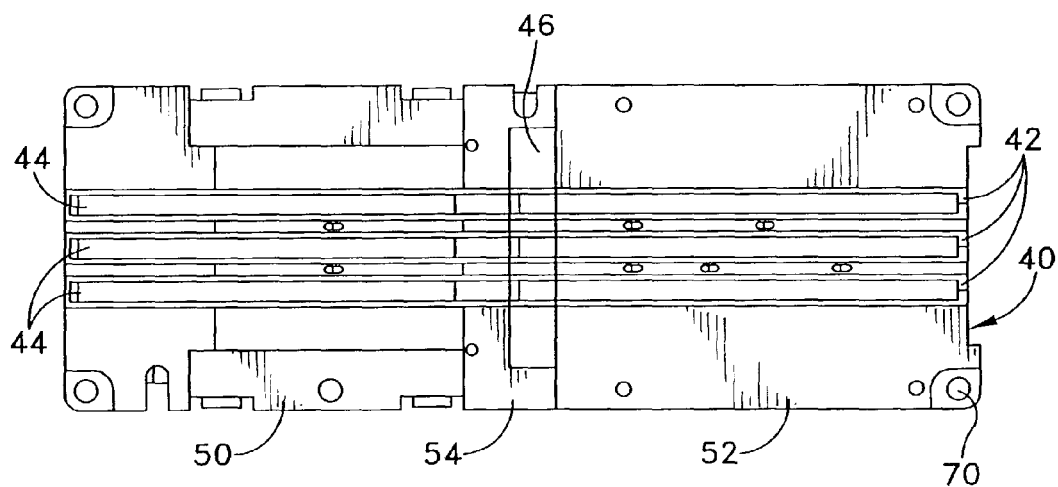
FIG. 4 is a bottom view of the bi-level heat sink shown in FIG. 1.

Referring to FIGS. 2–4, the bi-level heat sink 30 formed in accordance with one exemplary embodiment of the present invention includes a base 32, processor fins 34 and power supply fins 36.

Processor fins 34 and power supply fins 36 are preferably folded fins formed from a single sheet of metal, such as aluminum or copper. Although shown in FIGS. 1 and 3 as two separate folded fins, alternatively, processor fins 34 and power supply fins 36 may be formed from a single sheet of metal. By folding the fins over themselves, the folded fin assembly provides a large surface area in a small space with a low weight. Folded fin technology maximizes surface area and minimizes pressure drop, thus increasing the flow of heat from the heat generating source to the air. Preferably, the folded fin has an open top design to allow for natural convection, in addition to forced convection. Other alternative types of fin structures may also be employed including extruded, stamped, cold forged or machined fins, pin fins, bonded fins, or the like.

Referring again to FIGS. 1–4, base 32 includes a plate 40, channels 42 and embedded heat pipes 44. Plate 40 is comprised of a solid conductive metal, which is preferably aluminum or copper. Plate 40 includes a lower level 50, an upper level 52 and a connecting section 54 between the lower and upper levels, which may be referred to as an offset, a bent section, or a dog-leg 54. Plate 40 has an opening 46 in the offset 54 to provide clearance for bends in heat pipes 44, since the heat pipes typically don't include a zero-radius or mitered joint. Lower level 50 of plate 40 is mechanically and conductively coupled to processor 10. Upper level 52 is mechanically and conductively coupled to power supply 20. Offset 54 connects lower level 50 and upper level 52.

The base 40 has a lower condenser section 51 and an upper condenser section 53, and the at least one fin structure includes a first fin structure 34 attached to the lower condenser section 51 and a second fin structure 36 attached to the upper condenser section 53. The base 40 has a lower evaporator section 55 located on top of the processor 10 and the upper evaporator section 56 located on top of the component 20.

The height difference between lower level 50 and upper level 52 of plate 40 depends on the differing heights of the processor 10 and power supply 20.

In the exemplary embodiment of FIGS. 1–3A, the first and second fin structures 34, 36 have different heights H1 and H2, respectively, from each other. The first fin structure 34 is above the processor 10. The second fin structure 36 is above the component (power supply) 20. In the embodiment of FIGS. 1–3A, the first fin structure 34 has a greater height H1 (measured from the bottom of the fin structure to the top of the fin structure) than the height H2 of the second fin structure 36. As best seen in FIG. 3A, the top of fin structures 34 and 36 are at the same height H3 (measured from the printed circuit board 12 beneath processor 10 and power supply 20, so that the tops 34t, 36t of the fin structures 34 and 36 are parallel. Having the tops 34t and 36t parallel allows the maximum fin surface area if there is a fixed height available in the space above the printed circuit board 12.

FIG. 3B shows a heat sink 130 with fin structures 134 and 136, which are variations of the fin structures of FIG. 3A. Heat sink 130 has a base plate 140, with a lower portion 150 and an upper portion 152. In heat sink 130, the first fin structure 134 is above the processor 10, the second fin structure 136 is above the component 20, and the first fin structure 134 has a greater height H4 than height H5 of the second fin structure, measured from a bottom of each respective fin structure to a top 134t, 136t of each fin structure 134 and 136, respectively. The top 134t of the first fin structure 134 attached to the lower condenser section 150 is above a top 136t of the second fin structure 136 attached to the upper condenser section 152. Using a taller fin structure 134 over the processor 10 (which generates more heat) provides greater fin surface area for dissipating heat where it is most needed.

Referring again to FIG. 4, channels 42 may be milled into lower level 50 and upper level 52 of plate 40, and run substantially the length of plate 40, with the exception of the offset section 54 containing opening 46.

Heat pipes 44 are situated within respective channels 42. Although base 32 is shown as having three channels 42 with three respective heat pipes 44, any number of heat pipes may be used depending on the application and its heat transfer requirements. Preferably, heat pipes 44 are attached to or embedded within channels 42 by epoxy adhesive bonding, but may be attached by any means known to those skilled in the art including brazing, soldering or the like.

Figure 5:
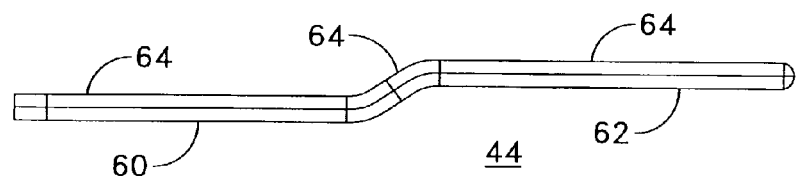
FIG. 5 is a side view of a heat pipe to be embedded in the base of the bi-level heat sink of FIG. 1.

Referring to FIG. 5, heat pipe 44 is an elongated tube, preferably made of aluminum or copper, and having an s-bent shape, including lower evaporator section 60, upper evaporator section 62, condenser section 64, a wick structure (not shown), and a working fluid (not shown). Evaporator section 60 of heat pipe 44 is situated within lower level 50 of plate 40 and is conductively coupled with processor 10. Evaporator section 62 is situated within upper level 52 of plate 40 and is conductively coupled with power supply 20. Condenser section 64 includes all of the portions of the heat pipe 44 that are remote from the heat sources, including the top and the entire offset portion between evaporator sections 60 and 62. Condenser section 64 includes a section which contains the s-bend between lower evaporator section 60 and upper evaporator section 62.

As is understood to those of ordinary skill in the art, heat pipe 44 is a vacuum tight tube which is evacuated and then back-filled with a small quantity of working fluid, just enough to saturate the wick structure. The atmosphere inside the heat pipe is set by an equilibrium of liquid and vapor. The type of working fluid depends on the working temperature range, and may include water, methanol acetone or ammonia or the like for microprocessor applications. The wick structure is preferably a sintered powdered metal wick. Alternative wick structures include, for example, a groove, screen, or cable/fiber wick.

Referring again to FIG. 1, the bi-level heat sink/processor/power supply assembly 11 is assembled in the following manner. Processor fins 34 and power supply fins 36 are attached to a top surface of base 32 by soldering, adhesion bonding, brazing or the like. Lower level 50 and upper level 52 of plate 40 of base 32 are then mechanically attached to processor 10 and power supply 20, respectively, through any means known to one of ordinary skill in the art. Base 32 of heat sink 30 may, for example, include openings 70 for receipt of fasteners for fastening base 32 to processor 10 and power supply 20. Base 32 may also include alignment pins 72 for ensuring proper alignment with these heat generating sources. Conductive thermal interfaces between the processor 10 and plate 50, and between power supply 20 and plate 52 may be formed using thermal grease, indium, solder, conductive epoxy, silicon adhesive, or any other conventional means.

Although the exemplary component 20 of FIG. 1 is a power supply, it is contemplated that other component heat sources, such as co-processors, memories, or other integrated circuit packages located proximate to the processor 10 may be cooled using the exemplary heat sink 30. Although the heat sink/multi-heat source assembly discussed above has been described in terms of the heat sink thermally connected to a processor and power supply of differing heights, such a multi-level heat sink could be used in connection with any two heat sources of differing heights.

In the exemplary embodiments, it is advantageous to have the processor 10 below the lower level 50 of the plate 40, because this allows a taller fin structure above the processor 10, which generates more heat than power supply 20. Although the exemplary embodiment has the lower level 50 of the plate 40 on processor 10 and the upper level 52 of the plate on the power supply 20, embodiments are also contemplated in which the lower level is on the power supply and the upper level is on the power supply.

Although the exemplary embodiment has two levels, it is contemplated that heat sinks according to the invention may include three or more levels to cool three or more components or heat sources of differing heights that are located next to each other.

Figure 6:
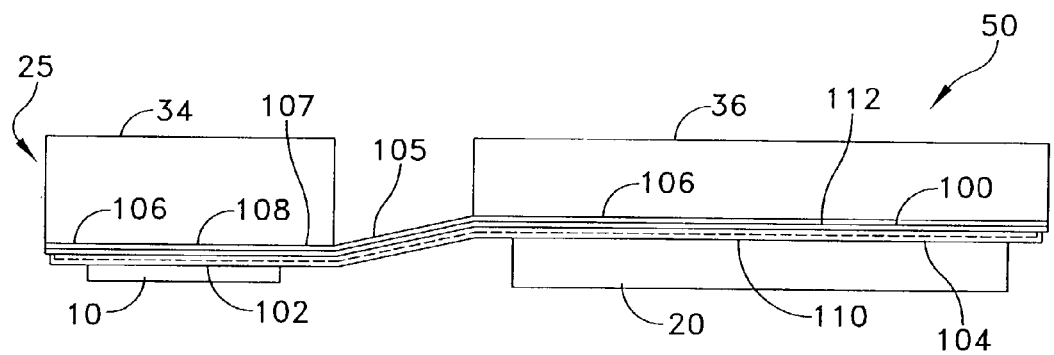
FIG. 6 is a top view of a bi-level heat sink having bi-level vapor chamber formed in accordance with another embodiment of the present invention.

Referring to FIG. 6, a bi-level heat sink 50 formed in accordance with another embodiment of the present invention includes a processor 10, a power supply 20 and a bi-level heat sink 25. The processor and power supply are preferably adjacent to one another and have respectively different heights, as measured from the printed circuit board 12 on which they are both mounted to the top of each device. The processor 10 may include any type of integrated circuit package, but is preferably a microprocessor or CPU for computer applications. A preferred application for use of assembly 50 is workstations or servers employing Intel "ITANIUM™" 64-bit processors, wherein one current design includes the processor and the power supply situated beside each other on the board.

Figure 7:
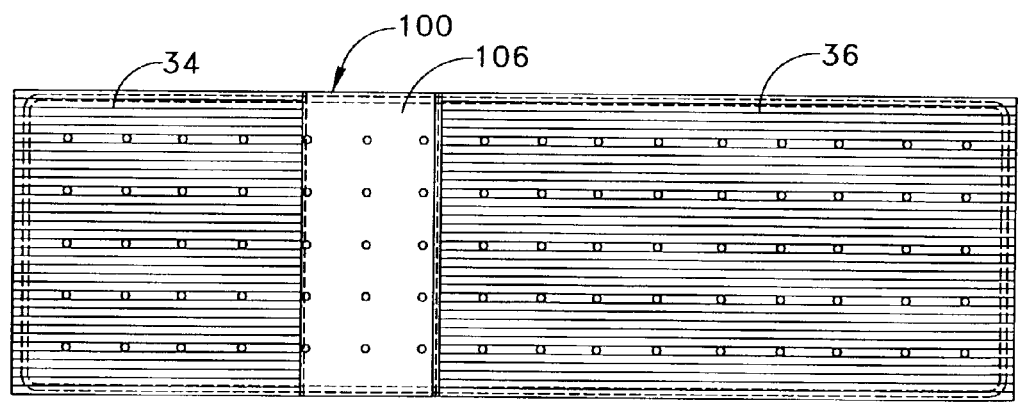
FIG. 7 is a cross-sectional view of the bi-level heat sink shown in FIG. 5.

Referring to FIGS. 6–7, the bi-level heat sink 25 includes a bi-level vapor chamber 100, processor fins 34 and power supply fins 36. Items in FIGS. 6 and 7 that are the same as items in FIGS. 1–5 are indicated by identical reference numerals. Rather than having a plurality of discrete tubes 44 (as in FIG. 1), heat sink 25 has a single continuous vapor chamber 100 that is nearly as wide as the plates 108 and 110. This unitary vapor chamber 100 provides enhanced temperature leveling across the width of the plates 108 and 110.

Processor fins 34 and power supply fins 36 are preferably folded fins formed from a single sheet of metal, such as aluminum or copper. Although shown in FIG. 6 as two separate folded fins, alternatively, processor fins 34 and power supply fins 36 may be formed from a single sheet of metal. Preferably, the folded fin has an open top design to allow natural convection with the ambient air, as well as forced convection. Other alternative types of fin structures may also be employed including extruded, stamped, cold forged or machined fins, pin fins, bonded fins, or the like.

Vapor chamber 100 is a vacuum vessel including lower evaporator section 102, upper evaporator section 104, condenser section 106, top plate 108, bottom plate 110, a wick structure (not shown) and a working fluid (not shown). Vapor chamber 100 preferably also includes a plurality of internal posts 112 which act as spacers. These internal posts 112, which may be solid, extend between the inside surfaces of the top plate 108 and bottom plate 110. Internal posts 112 prevent the plates from bowing inward, and therefore assist in maintaining a flat surface for proper thermal contact with processor 10, power supply 20 and fins 34 and 36. Alternatively, the internal posts may be porous, and may assist in providing a capillary path for movement of condensed working fluid from the top (near the fins) to the bottom, which receives heat from the processor 10 and power supply 20. For this purpose, sintered posts may be advantageous.

Lower evaporator section 102 is mechanically and conductively coupled to processor 10. Upper evaporator section 104 is mechanically and conductively coupled to power supply 20. Condenser Section 106 includes the entire top 108 of the vapor chamber, plus the portion 105 between evaporator sections 102 and 104. Condenser section 106 includes a lower condenser section 107 and an upper condenser section 109. Condenser section 106 includes a section 105 which contains an s-bend between lower condenser section 107 and upper condenser section 109. The height difference between lower evaporator section 102 and upper evaporator section 104 of vapor chamber 100 depends on the differing heights of the processor 10 and power supply 20.

Top plate 108 and bottom plate 110 of vapor chamber 100 are preferably comprised of stamped copper and are preferably sealed together with a welding process. The wick structure is preferably a copper powder wick which is sintered into place on inside surfaces of the top and bottom plates 108 and 110. The wick structure is preferably also present on the surface of internal posts 112. Alternative wick structures may also be used including, groove, screen or cable/fiber. The type of working fluid will depend on the working temperature range, but will typically include water, methanol, acetone or ammonia for processor applications.

Referring again to FIG. 6, the bi-level heat sink assembly 50 is assembled in the following manner. Processor fins 34 and power supply fins 36 are attached to a top surface of top plate 108 by soldering, adhesion bonding, brazing or the like to form heat sink 25. Lower evaporator section 102 and upper evaporator section of vapor chamber 100 are then mechanically attached to processor 10 and power supply 20, respectively, through any means known to one of ordinary skill in the art. Custom mechanical and attachment features can be readily designed into heat sink 25 for attachment to the heat generating sources. The vapor chamber 100 may be captured in a plastic or aluminum frame, allowing for a variety of mounting and alignment features that can be matched to a specific system assembly process. In addition, vapor chamber 100 and fins 34 and 36 of heat sink 25 can be manufactured with through-holes sized and spaced for specific applications.

Referring to FIGS. 1 and 6, the bi-level heat sink assembly 11 and 50 operate in the following manner. Heat generated by the processor 10 and power supply 20 is applied to the lower evaporator section 60 or 102 and upper evaporator section 62 or 104 of heat pipes 44 or vapor chamber 100 of bi-level heat sink 30 or 25, respectively. As this heat is applied, the fluid located at these heated evaporator sections immediately vaporizes and the vapor rushes to fill the vacuum. The rate of fluid vaporization at each heat source will stabilize and the heat pipes 44 or vapor chamber 100 are nearly isothermal. Wherever the vapor comes into contact with a cooler surface, such as in the condenser section 64 or 106 of heat pipes 44 or vapor chamber 100, respectively, it condenses, releasing its latent heat of vaporization. The condensed working fluid returns to the heat source via capillary action of the wick structure in the heat pipes or vapor chamber, ready to be vaporized again and repeat the cycle.

In the case of higher end processors which can generate in excess of one hundred watts of heat, the bi-level heat sink of the present invention allows excess heat from the processor to be transferred and dissipated by the fins above the power supply, a source which generates substantially less heat. This design efficiently utilizes the valuable space above the power supply.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A bi-level heat sink comprising:
   a first base portion having a first side and a second side, said first side defining at least one open channel for receiving a portion of at least one heat pipe;
   a second base portion having a first side and a second side, said first side of said second base portion defining at least one open channel corresponding to said at least one open channel in said first base portion for receiving a corresponding portion of said at least one heat pipe;
   an offset located between said first base portion and said second base portion so that (i) said first side of said first base portion is lower than said first side of said second base portion and (ii) said second side of said first base portion is lower than said second side of said second base portion, said offset including a portion of said open channel defining an opening that exposes at least one of said at least one heat pipes; and
   at least one fin structure positioned upon said second sides of said first base portion and said second base portion.

2. An assembly formed with the bi-level heat sink according to claim 1 wherein said first side of said first base portion thermally engages a processor and said first side of said second base portion thermally engages a heat generating component.

3. An assembly formed with the bi-level heat sink according to claim 1 wherein said first side of said first base portion thermally engages a heat generating component and said first side of said second base portion thermally engages a processor.

4. A bi-level heat sink comprising:
   a first base portion having a first side and a second side, said first side defining an open channel for receiving a portion of at least one heat pipe;
   a second base portion having a first side and a second side, said first side of said second base defining an open channel corresponding to said open channel in said first base portion and each receiving a corresponding portion of said at least one heat pipe;
   an offset located between said first base portion and said second base portion so that (i) said first side of said first base portion is lower than said first side of said second base portion and (ii) said second side of said first base portion is lower than said second side of said second base portion, said offset including a portion of said open channel defining an opening that exposes at least one of said at least one heat pipes; and
   at least one fin structure positioned upon said second sides of said first base portion and said second base portion.

5. A heat sink comprising:
   a first base portion having a first side and a second side, said first side defining an open channel for receiving a portion of two heat pipes;
   a second base portion having a first side and a second side, said first side of said second base defining an open channel corresponding to said open channel in said first base portion and each receiving a corresponding portion of said two heat pipes;
   an offset located between said first base portion and said second base portion so that (i) said first side of said first base portion is lower than said first side of said second base portion and (ii) said second side of said first base portion is lower than said second side of said second base portion, said offset including a portion of said open channel defining an opening that exposes at least one of said two heat pipes; and
   at least one fin structure positioned upon said second side of said first base portion and said second base portion.

6. A bi-level heat sink comprising:
   a first base portion having a first side and a second side, said first side defining an open channel for receiving a portion of two heat pipes;
   a second base portion having a first side and a second side, said first side of said second base defining an open channel corresponding to said open channel in said first base portion and each receiving a corresponding portion of said two heat pipes;
   an offset located between said first base portion and said second base portion so that (i) said first side of said first base portion is lower than said first side of said second base portion and (ii) said second side of said first base portion is lower than said second side of said second base portion, said offset including a portion of said open channel defining an opening that exposes at least one of said two heat pipes; and
   a fin structure located on said second side of each of said first base portion and said second base portion.

7. An assembly comprising:
   a processor having a first height;
   a component adjacent to said processor, said component being a heat source and having a second height;
   a bi-level heat sink positioned in thermal engagement with said processor and said heat generating component, and including:
      a first base portion having a first side and a second side, said first side defining an open channel for receiving a portion of two heat pipes;
      a second base portion having a first side and a second side, said first side of said second base defining an open channel corresponding to said open channel in said first base portion and each receiving a corresponding portion of said two heat pipes;
      an offset located between said first base portion and said second base portion so that (i) said first side of said first base portion is lower than said first side of said second base portion and (ii) said second side of said first base portion is lower than said second side of said second base portion, said offset including a portion of said open channel defining an opening that exposes at least one of said two heat pipes; and
      a fin structure located on said second side of each of said first base portion and said second base portion.

8. An assembly according to claim 7 wherein said first side of said first base portion thermally engages said processor and said first side of said second base portion thermally engages said heat generating component.

9. An assembly according to claim 7 wherein said first side of said first base portion thermally engages said heat generating component and said first side of said second base portion thermally engages said processor.

* * * * *